US009276035B2

(12) United States Patent
Nishimaki

(10) Patent No.: US 9,276,035 B2
(45) Date of Patent: Mar. 1, 2016

(54) SOLID-STATE IMAGING DEVICE AND MANUFACTURING METHOD OF SOLID-STATE IMAGING DEVICE

(71) Applicant: FUJIFILM Corporation, Tokyo (JP)

(72) Inventor: Makio Nishimaki, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/604,209

(22) Filed: Jan. 23, 2015

(65) Prior Publication Data
US 2015/0194464 A1 Jul. 9, 2015

Related U.S. Application Data

(60) Division of application No. 14/039,949, filed on Sep. 27, 2013, now Pat. No. 8,981,509, which is a continuation of application No. PCT/JP2012/055349, filed on Mar. 2, 2012.

(30) Foreign Application Priority Data

Mar. 31, 2011 (JP) ................. 2011-079263

(51) Int. Cl.
| H01L 27/00 | (2006.01) |
| H01L 27/146 | (2006.01) |
| H01L 31/02 | (2006.01) |
| H01L 31/18 | (2006.01) |

(52) U.S. Cl.
CPC ...... *H01L 27/14687* (2013.01); *H01L 27/1464* (2013.01); *H01L 27/14607* (2013.01); *H01L 27/14629* (2013.01); *H01L 27/14643* (2013.01); *H01L 27/14689* (2013.01); *H01L 31/02* (2013.01); *H01L 31/18* (2013.01)

(58) Field of Classification Search
CPC .............. H01L 27/14643; H01L 27/1464; H01L 27/14629; H01L 31/18
USPC ............................................. 438/65
See application file for complete search history.

(56) References Cited

U.S. PATENT DOCUMENTS

| 5,566,007 | A | 10/1996 | Ikeda et al. |
| 8,420,434 | B2 | 4/2013 | Yamamoto et al. |
| 8,928,784 | B2 * | 1/2015 | Watanabe ........... H01L 27/1464 257/291 |
| 2005/0040440 | A1 | 2/2005 | Murakami |

FOREIGN PATENT DOCUMENTS

| JP | 2007-318002 A | 12/2007 |
| JP | 2009-232392 A | 10/2009 |
| JP | 2011-014773 A | 1/2011 |

OTHER PUBLICATIONS

Chinese Office Action and Search Report for Chinese Application No. 201280017002.0, dated Jul. 31, 2015, with an English translation.
International Search Report, issued in PCT/JP2012/055349, dated Apr. 3, 2012.
PCT/ISA/237, issued in PCT/JP2012/055349, dated Apr. 3, 2012.

* cited by examiner

*Primary Examiner* — Tran Tran
(74) *Attorney, Agent, or Firm* — Birch, Stewart, Kolasch & Birch, LLP

(57) ABSTRACT

A light receiving layer is formed with an array of photodiodes for accumulating signal charge produced by photoelectric conversion of incident light. A wiring layer provided with electrodes and wiring for controlling the photodiodes is formed behind the light receiving layer in a traveling direction of the incident light. In the light receiving layer, there is formed a projection and depression structure in which a pair of inclined surfaces have symmetric inclination directions and each inclined surface corresponds to each photodiode. Each inclined surface makes the incident light enter each photodiode by a light amount corresponding to an incident angle.

2 Claims, 14 Drawing Sheets

SOLID-STATE IMAGING DEVICE AND MANUFACTURING METHOD OF SOLID-STATE IMAGING DEVICE

CROSS REFERENCE TO RELATED APPLICATIONS

This application is a Divisional of Co-Pending application Ser. No. 14/039,949, filed on Sep. 27, 2013, which is a Bypass Continuation of PCT International Application No. PCT/JP2012/055349 filed on Mar. 2, 2012, which claims priority under 35 U.S.C §119(a) to Patent Application No. 2011-079263 filed in Japan on Mar. 31, 2011, all of which are hereby expressly incorporated by reference into the present application.

BACKGROUND OF THE INVENTION

1. Field of the Invention

The present invention relates to a solid-state imaging device and a manufacturing method thereof, and more specifically, relates to a so-called rear surface irradiation type soli-state imaging device, which allows incidence of light on a rear surface side being an opposite side from a surface formed with electrodes and wiring.

2. Description Related to the Prior Art

Conventionally, a CMOS imaging device is widely known as an imaging device to be mounted in a digital camera or the like. The conventional CMOS imaging device (hereinafter simply called imaging device) has a silicon substrate formed with photodiodes (hereinafter called PDs) on its surface, and electrodes, wiring, and the like provided on the silicon substrate to scan the photodiodes. Furthermore, a color filter, microlenses, and the like are formed on layers of the electrodes, the wiring, and the like, so light from an object passes through the microlens and the color filter and then is incident upon the PD through space between the electrode and the wiring and the like.

In the so-called front surface irradiation type imaging device as described above, it is known that the electrode, the wiring, and the like limit an aperture ratio. Especially, when increase in pixel number downsizes each individual pixel, it is known that layers of the electrode, the wiring, and the like have to be deep and the aperture ratio is further reduced.

Considering above, a rear surface irradiation type imaging device is known as an imaging device having such a structure that increase in a pixel number does not contribute reduction in an aperture ratio (U.S. Pat. No. 8,420,434 corresponding to Japanese Patent Laid-Open Publication No. 2005-150463). The rear surface irradiation type imaging device is an imaging device that is provided with electrodes, wiring, and the like on a back side of PDs when viewed from a light incident direction, so incident light passed through a microlens and a color filter reaches the PD without being blocked by the electrode, the wiring, and the like. Thus, the rear surface irradiation type imaging device facilitates increase in an aperture ratio, as compared with the front surface irradiation type imaging device.

Also, a widely available digital camera or the like of recent years has a focus detection function, which allows automatic focus adjustment. As a method of focus detection, there is known a so-called phase difference AF method in which two types of images having a horizontal (or vertical) phase difference are obtained and a focus position is calculated based on the distance between the images. For example, in a digital camera or the like that performs the phase difference AF, an imaging device is provided with a pair of pixels, composed of a first pixel having an asymmetric structure likely to receive light from a left direction with respect to an optical axis and a second pixel having an asymmetric structure likely to receive light from a right direction, as pixels (hereinafter called phase difference pixels) for use in the phase difference AF, and the focus position is calculated based on pixel values of these pixels.

In recent years, since the automatic focus adjustment is a standard function of a digital camera or the like, it is desired that the rear surface irradiation type imaging device is also provided with the phase difference pixels to allow performance of the phase difference AF. However, for example, the horizontally asymmetric structure of the phase difference pixel is formed by a light shielding film provided in front of the PD, and there is a problem that forming the asymmetric structure of the phase difference pixel using the light shielding film impairs performance originally expected of the rear surface irradiation type imaging device, i.e. increase in the aperture ratio.

SUMMARY OF THE INVENTION

The present invention aims at providing a rear surface irradiation type imaging device having phase difference pixels with preventing reduction in an aperture ratio, and a manufacturing method thereof.

A solid-state imaging device according to the present invention has a light receiving layer that has an arrangement of a plurality of light receiving portions, which accumulate signal charge produced by photoelectric conversion of incident light, and is formed on an incident side of the incident light relative to a wiring layer, which is provided with an electrode and wiring for controlling the light receiving portions. In the light receiving layer, there is formed a projection and depression structure in which two types of inclined surfaces having symmetric inclination directions are alternately disposed and each inclined surface corresponds to each light receiving portion. Each inclined surface makes the incident light enter the light receiving portion by a light amount corresponding to an incident angle.

The light receiving layer preferably has a first layer formed with the light receiving portions and a second layer for planarizing the projection and depression structure, and the inclined surface is preferably a surface formed by etching the first layer.

The first layer is preferably a single crystal silicon layer.

It is preferable that the etching is crystal anisotropic etching and the inclined surface is a crystal surface of the single crystal silicon layer.

It is preferable that the first layer is formed such that a (100) surface faces to a surface of the solid-state imaging device and the inclined surface is made of a (111) surface.

The projection and depression structure is preferably formed of an arrangement of a plurality of depressions or projections.

The inclined surface is preferably an inclined surface of a square pyramid-shaped depression or projection.

The inclined surface is preferably an inclined surface of a triangular prism-shaped depression or projection.

A manufacturing method of a solid-state imaging device according to the present invention includes a thermal oxide film forming step, a silicon layer forming step, a light receiving layer forming step, a wiring layer forming step, a support substrate adhering step, a thermal oxide film patterning step, an etching step, and a planarizing layer forming step. In the thermal oxide film forming step, a thermal oxide film is formed on a silicon substrate. In the silicon layer forming step, a silicon layer is formed on the thermal oxide film. In the light receiving layer forming step, light receiving portions for producing signal charge in accordance with an amount of incident light by photoelectric conversion of the incident light are formed in an exposed surface of the silicon layer. In the wiring layer forming step, a wiring layer having an electrode and wiring for controlling the light receiving portions is formed on the silicon layer. In the support substrate adhering step, a support substrate is adhered on the wiring layer. In the thermal oxide film patterning step, the silicon substrate is removed to expose the thermal oxide film and the thermal oxide film is patterned in a predetermined pattern. In the etching step, the silicon layer is etched by using the patterned thermal oxide film as a mask so as to form in the silicon layer a projection and depression structure that has alternately disposed two types of inclined surfaces having symmetric inclination directions, and is provided in the light receiving layer such that each of the inclined surfaces corresponds to each of the light receiving portions, and makes the incident light enter the light receiving portion by a light amount corresponding to an incident angle. In the planarizing layer forming step, a planarizing layer for planarizing the projection and depression structure is formed on the projection and depression structure.

A manufacturing method of a solid-state imaging device according to the present invention includes a groove forming step, a thermal oxide film forming step, a thermal oxide film grinding step, a silicon layer forming step, a light receiving layer forming step, a wiring layer forming step, a support substrate adhering step, an etching step, and a planarizing layer forming step. In the groove forming step, a groove of a predetermined pattern is formed on a silicon substrate. In the thermal oxide film forming step, a thermal oxide film is formed on a surface of the silicon substrate formed with the groove. In the thermal oxide film grinding step, the thermal oxide film is grinded to expose the surface of the silicon substrate having the thermal oxide film embedded in a portion corresponding to the groove. In the silicon layer forming step, a silicon layer is formed on the surface formed with the groove. In the light receiving layer forming step, a light receiving layer is formed in an exposed surface of the silicon layer. The light receiving layer has an arrangement of a plurality of light receiving portions for accumulating signal charge produced by photoelectric conversion of incident light. In the wiring layer forming step, a wiring layer having an electrode and wiring for controlling the light receiving portions is formed on the silicon layer. In the support substrate adhering step, a support substrate is adhered on the wiring layer. In the etching step, the silicon substrate and the silicon layer are etched together by using a pattern of the thermal oxide film formed in the portion corresponding to the groove as a mask, so as to form in the silicon layer a projection and depression structure that has alternately disposed two types of inclined surfaces having symmetric inclination directions, and is provided in the light receiving layer such that each of the inclined surfaces corresponds to each of the light receiving portions, and makes the incident light enter the light receiving portions by a light amount corresponding to an incident angle. In the planarizing layer forming step, a planarizing layer for planarizing the projection and depression structure is formed on the projection and depression structure.

It is preferable that the silicon layer is a single crystal silicon layer formed by epitaxial growth of silicon, and the etching performed in the etching step is crystal anisotropic etching.

According to the present invention, it is possible to provide a rear surface irradiation type imaging device that includes phase difference pixels with an asymmetric structure to obtain phase difference information without reducing an aperture ratio (sensitivity), and a manufacturing method thereof.

BRIEF DESCRIPTION OF DRAWINGS

For more complete understanding of the present invention, and the advantage thereof, reference is now made to the subsequent descriptions taken in conjunction with the accompanying drawings, in which:

FIG. 4B is an explanatory view showing a step of providing single crystal silicon and the like;

FIG. 7A is an explanatory view showing a step of forming a planarizing layer and the like;

FIG. 9A is an explanatory view showing a step of forming single crystal silicon and the like;

FIG. 9B is an explanatory view showing a step of forming a wiring layer and the like;

DESCRIPTION OF THE PREFERRED EMBODIMENTS

Figure 1:
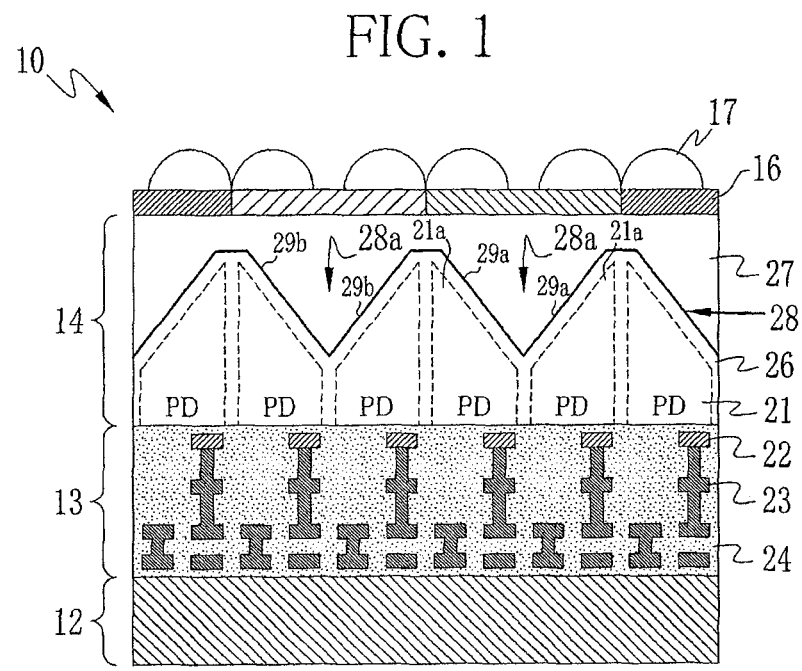
FIG. 1 is a cross sectional view showing the structure of an imaging device.
Figure 2:
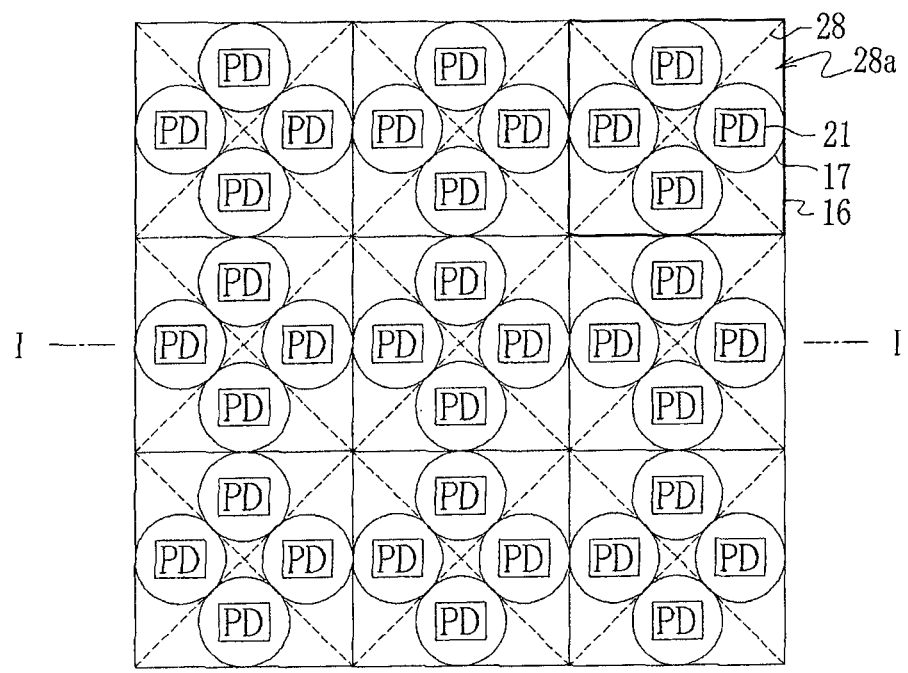
FIG. 2 is an explanatory view showing the structure of the imaging device.

As shown in FIG. 1 and FIG. 2, an imaging device 10, being a rear surface irradiation type imaging device, has a layer structure in which a wiring layer 13, a light receiving layer 14, a color filter 16, and microlenses 17 are orderly stacked on a support substrate 12 made of silicon, for example.

The wiring layer 13 is a layer in which electrodes 22 each for controlling readout of a signal from a PD 21 and the like and wiring 23 including an amplifier circuit for amplifying the signals obtained by the PDs 21 and the like are laminated via an interlayer insulating film 24. When a front surface refers to a side of the wiring layer 13 relative to the PDs 21 as in the case of a conventional front surface incident type imaging device, the support substrate 12 is in a topmost surface of the imaging device 10, and the wiring layer 13 is provided under the support substrate 12. The microlenses 17 are provided in a rearmost surface of the imaging device 10. Incident light from an object enters the imaging device 10 from its rear surface side.

The light receiving layer 14, being a layer formed with the PDs 21, is made of a single crystal silicon layer 26 and a planarizing layer 27. The single crystal silicon layer 26 and the planarizing layer 27 are provided in this order from the front surface side of the imaging device 10 on which the wiring layer 13 is provided. If a front side refers to an incident side of light, the light receiving layer 14 is formed on the front side of the wiring layer 13, and the wiring layer 13 is formed on a rear side of the light receiving layer 14.

The PDs 21 are formed in the single crystal silicon layer 26 joined flatly to the wiring layer 13. Light from the object enters the PD 21 from the rear surface of the imaging device 10 through the microlens 17, the color filter 16, and the planarizing layer 27, and the PD 21 produces signal charge by an amount corresponding to an amount of the light incident thereon by photoelectric conversion and accumulates the signal charge.

A rear surface of the single crystal silicon layer 26, i.e. an interface between the single crystal silicon layer 26 and the planarizing layer 27 is not flat but is formed into a projection and depression structure 28 in accordance with the arrangement of the PDs 21. The planarizing layer 27 is a layer for planarizing the projection and depression structure 28 to form the color filter 16 on the rear surface of the single crystal silicon layer 26, and is made of a transparent resin material, for example.

The projection and depression structure 28 has such a structure that a plurality of depressions 28a depressed against the front surface of the imaging device 10 are arranged in the rear surface of the single crystal silicon layer 26, and each depression 28a is formed into the shape of a four-sided pyramid. For example, inclined surfaces 29a and inclined surfaces 29b have symmetric inclination directions, and are formed alternately. A pair of inclined surfaces adjoining each other form one depression 28a. Also, the depression 28a is formed such that each inclined surface, which constitutes the depression 28a, corresponds to each PD 21.

The color filter 16 is a primary color filter having BGR three color segments, for example, and selectively transmits one of B, G, and R color of light that has been incident upon the microlens 17 and is reaching the PD 21. The color filter 16 is provided on the rear surface of the planarizing layer 27, and one of the colors is assigned to each individual depression 28a of the projection and depression structure 28. For example, a green color filter is assigned to the depression 28a formed with the inclined surfaces 29a, and a red color filter is assigned to the next depression 28a formed with the inclined surfaces 29b. Thus, the PDs 21 corresponding to the inclined surfaces of one depression 28a correspond to the same color of the color filter 16, and one color segment of the color filter 16 includes four PDs 21 (refer to FIG. 2). Note that, FIG. 1 shows a cross section taken along a line I-I in FIG. 2.

The microlens 17 is provided on the rearmost surface of the imaging device 10, being a light incident surface, and condenses incident light to the PD 21 disposed in a corresponding position. To be more specific, the microlenses 17 are formed on a rear side of the color filter 16. The number of the microlenses 17 is the same as that of the PDs 21, and each microlens 17 is disposed right behind each PD 21. Thus, the four microlenses 17 are provided in one color segment of the color filter 16.

The imaging device 10 having the structure as described above can obtain images having a horizontal (or vertical) phase difference due to phase difference AF. This is because the interface between the single crystal silicon layer 26 and the planarizing layer 27 is in the projection and depression structure 28. The four PDs 21 corresponding to the inclined surfaces of each depression 28a forming the projection and depression structure 28 are horizontally (or vertically) asymmetric in accordance with inclination directions of the inclined surfaces, because of difference in the inclination directions of the inclined surfaces of the depression 28a. Thus, light incident upon the imaging device 10 enters each PD 21 by a light amount corresponding to an incident angle, so a pair of PDs 21 facing to each other function as phase difference pixels.

For example, in FIG. 1, the two PDs 21a of the depression 28a having the inclined surfaces 29a function as the phase difference pixels for obtaining images having a horizontal phase difference. Likewise, the PDs 21 corresponding to the remaining two inclined surfaces positioned in a direction orthogonal to a plane of paper in FIG. 1, out of the inclined surfaces of the depression 28a having the inclined surfaces 29a, function as the phase difference pixels for obtaining a vertical phase difference. Therefore, the imaging device 10 can obtain phase difference information in two directions, i.e. the horizontal direction and the vertical direction.

Also, the projection and depression structure 28 is formed in the imaging device 10 to obtain the horizontal and vertical phase difference information, but the structure of the imaging device 10 excluding the light receiving layer 14, which includes the wiring layer 13, the color filter 16, the microlenses 17, and the like, is the same as that of a conventional rear surface irradiation type imaging device in shape and size.

Figure 3:
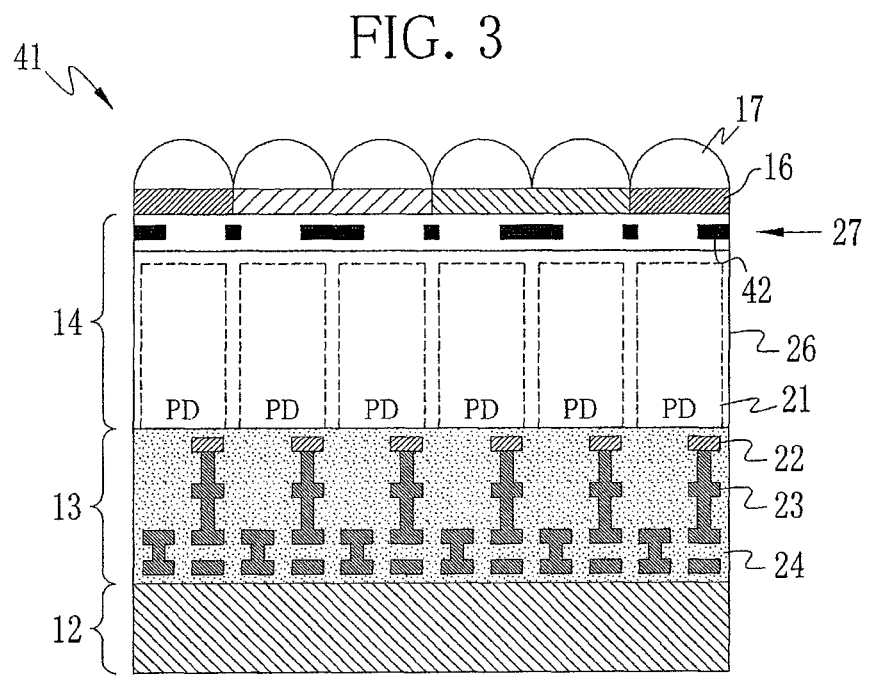
FIG. 3 is a cross sectional view showing the structure of an imaging device being a comparative example.

As shown in FIG. 3, an imaging device 41 of a comparative example is of a rear surface irradiation type, but an interface between the single crystal silicon layer 26 and the planarizing layer 27 is formed flat. Also, in the imaging device 41, a light shielding film 42 is provided in the planarizing layer 27 in order to provide a horizontally (or vertically) asymmetrical property to optical paths of the two PDs 21 composing a pair of pixel difference pixels. The light shielding film 42 blocks part of light incident upon the PDs 21 that function as the phase difference pixels, to produce a phase difference in the light incident upon each PD 21. For this reason, although the imaging device 41 is of the rear surface irradiation type, the light shielding film 42 brings about reduction in an aperture ratio due to the block of the incident light. Although the rear surface irradiation type imaging device has such a structure as to eliminate shade by the wiring layer 13 and increase the aperture ratio, the light shielding film 42 provided for the phase difference AF reduces the aperture ratio and hence deteriorates sensitivity.

As compared with the imaging device 41 that produces the phase difference using the light shielding film 42, the imaging device 10 produces the phase difference in the incident light using the projection and depression structure 28, so it is possible to maintain the aperture ratio at approximately 100% without losing an advantage of the rear surface irradiation type and to obtain images having a phase difference for the phase difference AF.

Figure 4A:
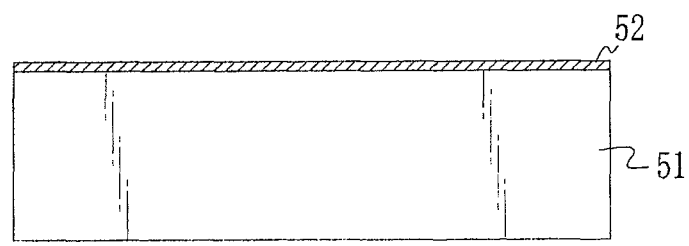
FIG. 4A is an explanatory view showing a step of forming a thermal oxide film on a silicon substrate.
Figure 4B:
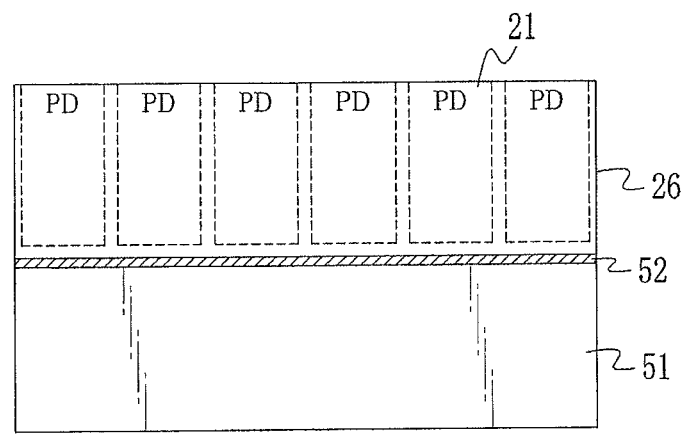

Next, manufacture of the imaging device 10 will be described. First, as shown in FIG. 4A, a thermal oxide film 52 is formed at least one of the surfaces of a silicon substrate 51. Then, as shown in FIG. 4B, the single crystal silicon layer 26 is formed on the thermal oxide film 52 by epitaxial growth of silicon. At this time, the single crystal silicon layer 26 makes crystal growth so as to expose a (100) surface. When the single crystal silicon layer 26 is formed in a predetermined thickness, the PDs 21 are formed by ion implantation or the like in the single crystal silicon layer 26 in an predetermined arrangement.

Figure 4C:
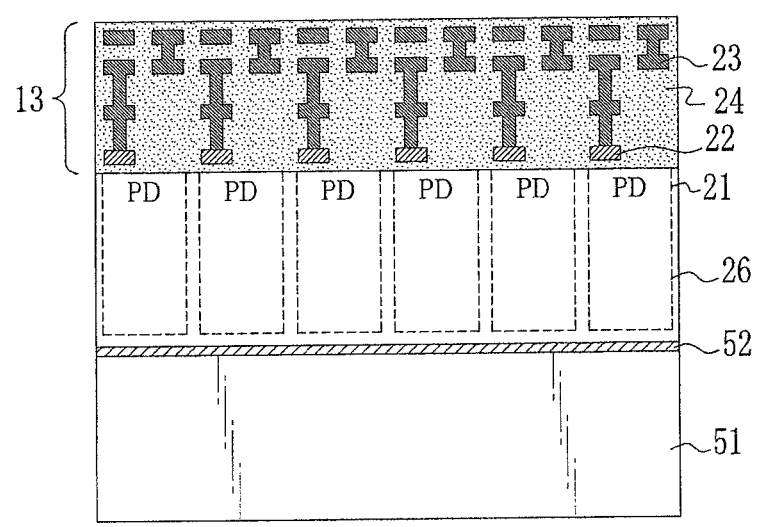
FIG. 4C is an explanatory view showing a step of providing a wiring layer.

After that, as shown in FIG. 4C, the electrodes 22 and the wiring 23 are provided on the single crystal silicon layer 26 in accordance with the arrangement of the PDs 21 to form the wiring layer 13. The interlayer insulating film 24 is provided for insulation between the electrode 22 and the wiring 23, and the electrode 22 and the wiring 23 are stacked each other.

Figure 5A:
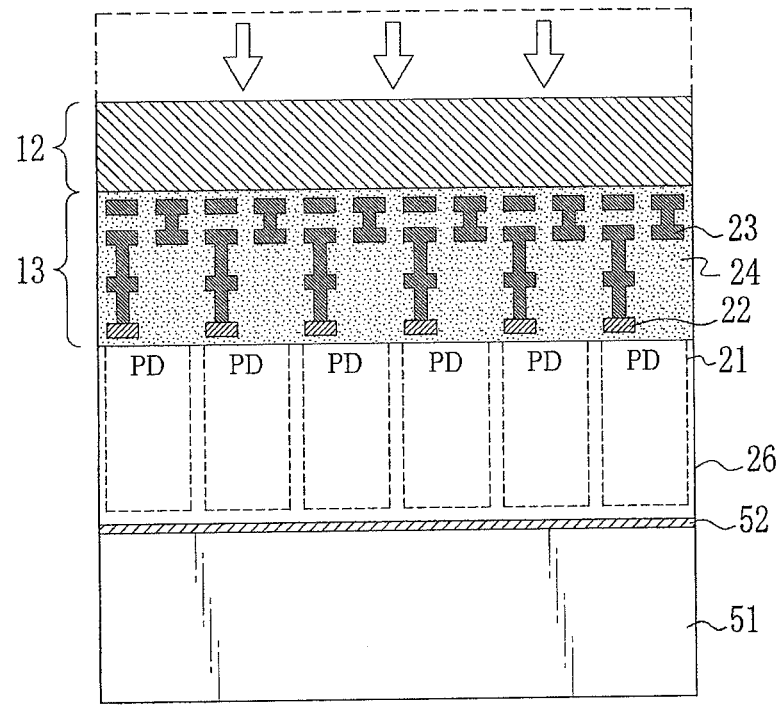
FIG. 5A is an explanatory view showing a step of providing a support substrate.

When the wiring layer 13 is formed on the single crystal silicon layer 26 like this, as shown in FIG. 5A, the support substrate 12 is adhered on a surface of the wiring layer 13. At this time, the adhered support substrate 12 is mechanically grinded to a predetermined thickness. By providing the support substrate 12 of the predetermined thickness like this, the single crystal silicon layer 26 and the wiring layer 13 are sandwiched between the silicon substrate 51 and the support substrate 12 without being exposed to the outside.

Figure 5B:
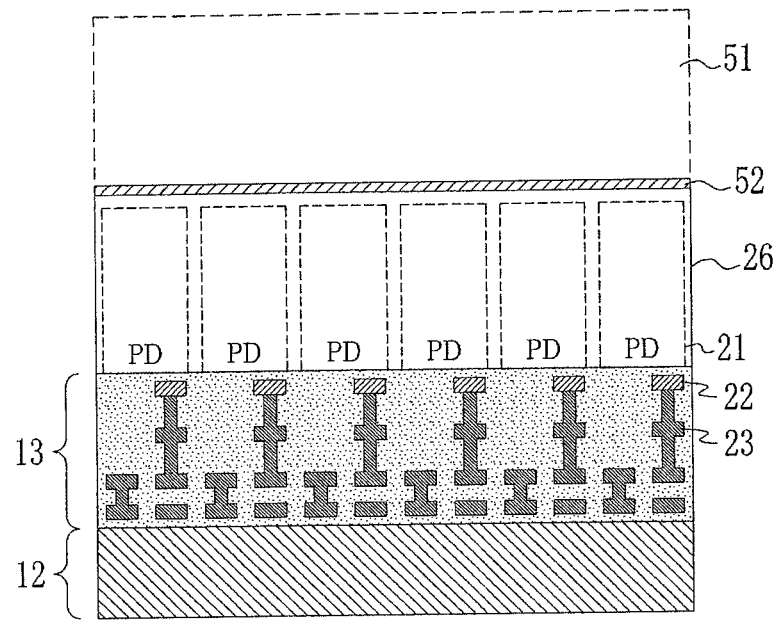
FIG. 5B is an explanatory view showing a step of removing the silicon substrate.

After that, as shown in FIG. 5B, imaging device 10 during the manufacture is turned upside down so that the support substrate 12 faces downward and the silicon substrate 51 faces upward. The exposed silicon substrate 51 is removed by mechanical grinding (or wet etching or the like) with leaving the thermal oxide film 52.

Figure 6A:
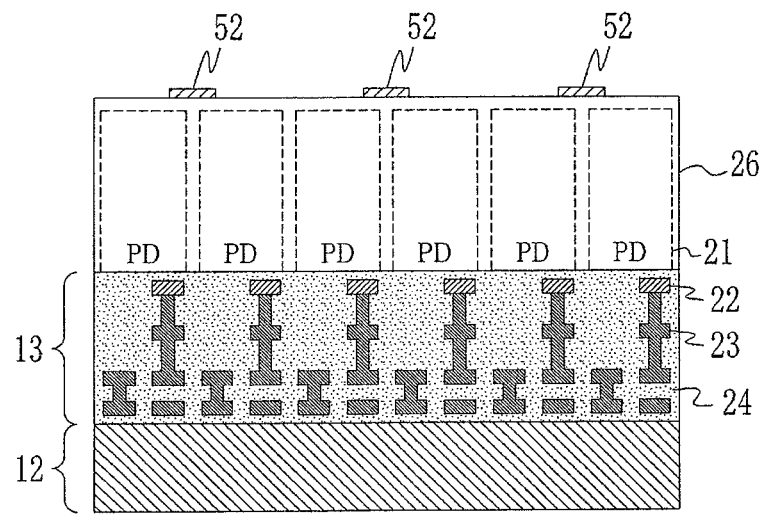
FIG. 6A is an explanatory view showing a step of patterning the exposed thermal oxide film.

As shown in FIG. 6A, the exposed thermal oxide film 52 is patterned in accordance with the shape and size of the PDs 21 and the projection and depression structure 28 to be formed. To be more specific, the thermal oxide film 52 is left in a portion approximately corresponding to a periphery of bottom sides of the grooves 28a in the shape of a sharp sign "#" (refer to FIG. 11 too), and the other portions including a portion corresponding to each inclined surface of the depressions 28a and the like are removed. Thus, the single crystal silicon layer 26 is partly exposed.

Figure 6B:
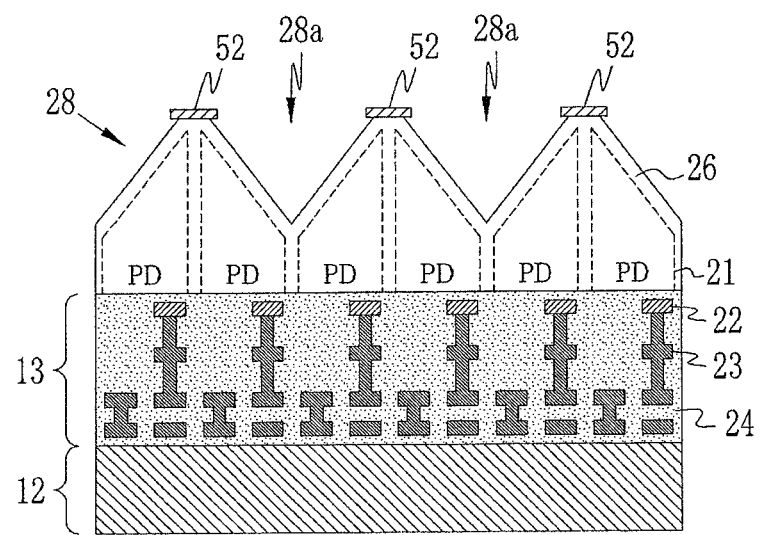
FIG. 6B is an explanatory view showing a step of forming a projection and depression structure.

After that, as shown in FIG. 6B, the single crystal silicon layer 26 is wet etched using the patterned thermal oxide film 52 as a mask. The etching of the single crystal silicon layer 26 performed here is so-called crystal anisotropic etching using an alkaline etchant such as KOH (potassium hydroxide), TMAH (tetra methyl ammonium hydroxide), EDP (ethylenediamine pyrocatechol), or $N_2H_4 \cdot H_2O$ (hydrazine hydrate), for example. Thus, the etching of the single crystal silicon layer 26 progresses according to crystal anisotropy, and a (111) surface that is harder to etch than the exposed (100) surface appears as the inclined surfaces. Accordingly, a plurality of square pyramid-shaped depressions 28a having the thermal oxide film 52 in the bottom sides are precisely formed in the rear surface of the single crystal silicon layer 26 and compose the projection and depression structure 28.

Figure 7A:
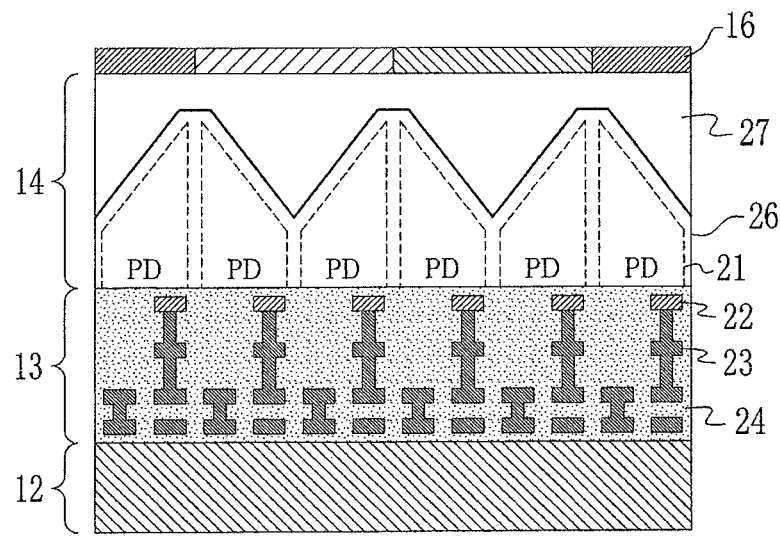
Figure 7B:
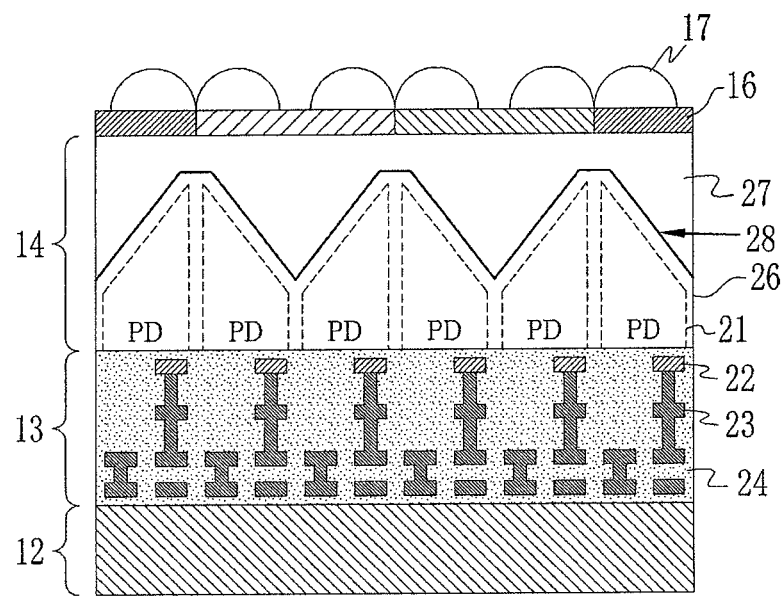
FIG. 7B is an explanatory view showing a step of forming microlenses.

As shown in FIG. 7A, after the formation of the projection and depression structure 28, the thermal oxide film 52 used as the etching mask is removed, and then the planarizing layer 27 is provided on the rear surface of the single crystal silicon layer 26 to form the light receiving layer 14. On the planarizing layer 27, the color filter 16 is formed in accordance with the arrangement of the PDs 21 and the projection and depression structure 28. Furthermore, as shown in FIG. 7B, on the color filter 16, the microlenses 17 are formed such that one microlens 17 corresponds to each PD 21, so the imaging device 10 is completed.

Note that, the above embodiment explains an example of a manufacturing method of the imaging device 10 that has the projection and depression structure 28 formed in the interface between the single crystal silicon layer 26 and the planarizing layer 27, but the imaging device 10 can be manufactured according to an embodiment described below.

Figure 8A:
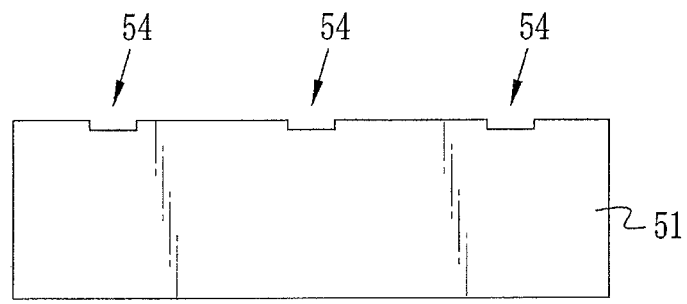
FIG. 8A is an explanatory view showing a step of providing grooves in a surface of the silicon substrate.

First, as shown in FIG. 8A, grooves 54 are patterned in the front surface of the silicon substrate 51. The grooves 54 correspond to the patterned thermal oxide film 52 of the above embodiment (refer to FIG. 6A), and are formed in accordance with the arrangement, shape, size, and the like of the PDs 21 and the projection and depression structure 28 to be formed later on. More specifically, the grooves 54 are formed in the shape of a sharp sign "#" (refer to FIG. 11 too). Note that, the grooves 54 are formed using a resist or a photomask.

Figure 8B:
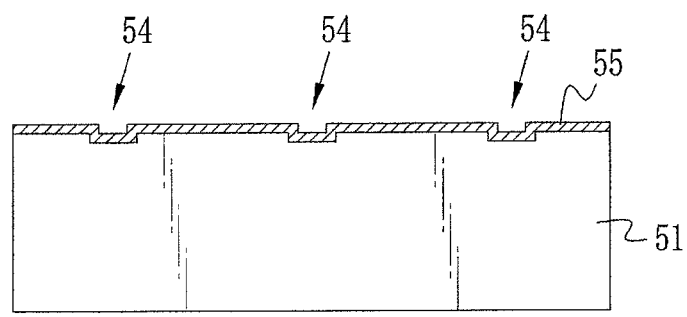
FIG. 8B is an explanatory view showing a step of forming the thermal oxide film.

As shown in FIG. 8B, when the grooves 54 are patterned in the front surface of the silicon substrate 51, the thermal oxide film 55 is formed in the front surface of the silicon substrate 51 formed with the grooves 54. The thermal oxide film 55 is formed uniformly not only in the front surface of the silicon substrate 51 but also in the interior of the grooves 54. Note that, the thermal oxide film 55 has a predetermined thickness or more at a portion in the grooves 54.

Figure 8C:
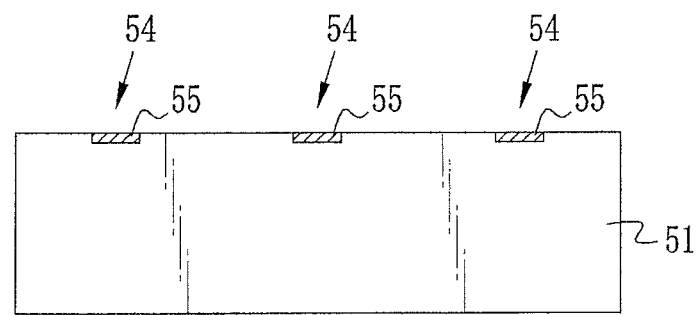
FIG. 8C is an explanatory view showing a step of patterning the thermal oxide film.

Then, as shown in FIG. 8C, the thermal oxide film 55 is removed by CMP (chemical mechanical polishing) so as to expose the surface of the silicon substrate 51. At this time, the thermal oxide film 55 remains in the grooves 54. Accordingly, the front surface of the silicon substrate 51 has such a structure that the thermal oxide film 55 is embedded in portions corresponding to the grooves 54.

Figure 9A:
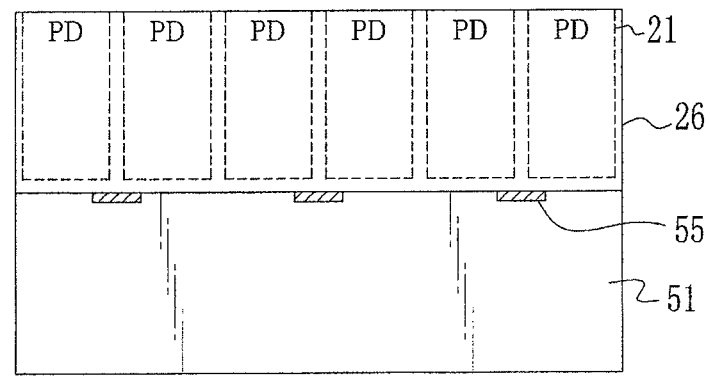

When the surface structure having the thermal oxide film 55 that is left in a state of being embedded in the portions corresponding to the grooves 54 is formed as described above, as shown in FIG. 9A, the single crystal silicon layer 26 is formed on the front surface of the silicon substrate 51 having a pattern of the thermal oxide film 55 by epitaxial growth of silicon. Also, PDs 21 are formed in the single crystal silicon layer 26 by ion implantation or the like. At this time, the positions of the PDs 21 are registered with respect to the pattern of the thermal oxide film 55.

Figure 9B:
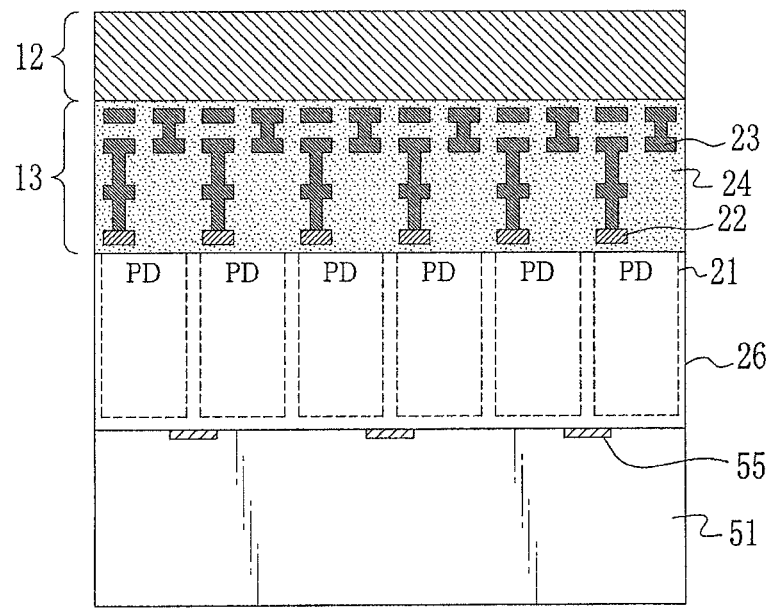

After that, as shown in FIG. 9B, the wiring layer 13 and the support substrate 12 are provided on the single crystal silicon layer 26 formed with the PDs 21. In the wiring layer 13, the electrode 22 and the wiring 23 are stacked via the interlayer insulating film 24. The support substrate 12 is mechanically grinded to a predetermined thickness after being adhered to the front surface of the wiring layer 13.

Figure 10A:
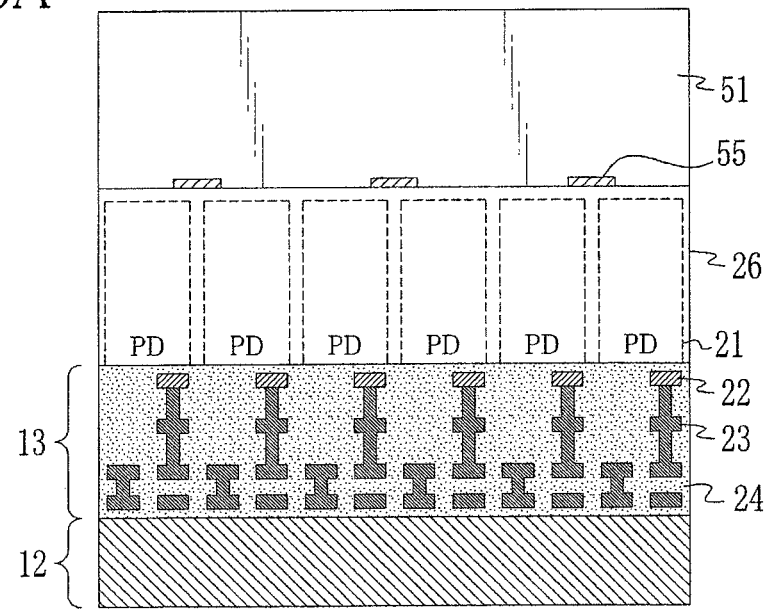
FIG. 10A is an explanatory view showing a state of being turned upside down.
Figure 10B:
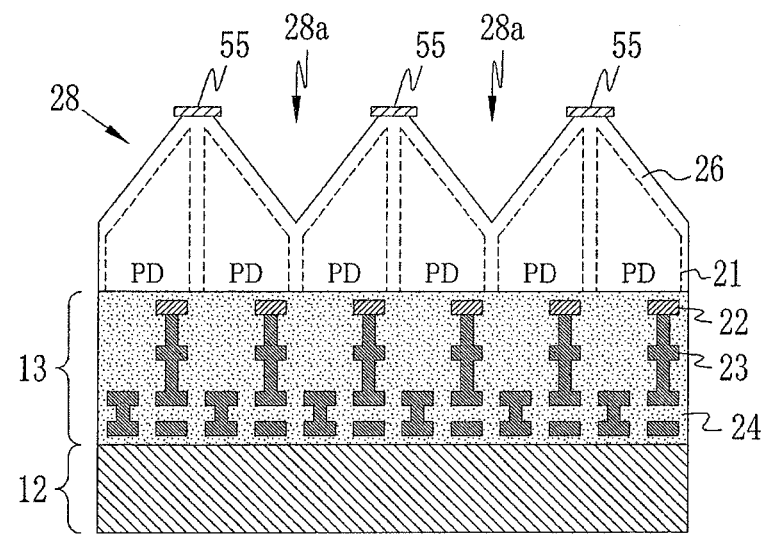
FIG. 10B is an explanatory view showing a step of forming a projection and depression structure.

After the provision of the support substrate 12, as shown in FIG. 10A, the imaging device 10 during the manufacture is turned upside down so that the silicon substrate 51 faces upward and the support substrate 12 faces downward. Then, as shown in FIG. 10B, crystal anisotropic etching is performed on the imaging device 10 during the manufacture having the silicon substrate 51 remaining, so the silicon substrate 51 is removed and the single crystal silicon layer 26 is etched using the pattern of the thermal oxide film 55 embedded in the grooves 54 as a mask. Thus, the projection and depression structure 28 is formed in the single crystal silicon layer 26.

After the projection and depression structure 28 is formed in the single crystal silicon layer 26, the pattern of the thermal oxide film 55 left at a highest portion (refer to FIG. 11, numerical numbers 56a and 56b) of the projection and depression structure 28 is removed. After that, the planarizing layer 27, the color filter 16, and the microlenses 17 are formed to complete the imaging device 10.

As described above, since a structure to be used later as the mask in the crystal anisotropic etching of the single crystal silicon layer 26 is formed in advance in the front surface of the silicon substrate 51 using the grooves 54 and the thermal oxide film 55, the silicon substrate 51 can be removed at the same time as the crystal anisotropic etching for forming the projection and depression structure 28. This reduces a step of removing the silicon substrate 51 and facilitates easy manufacturing of the imaging device 10.

Figure 11:
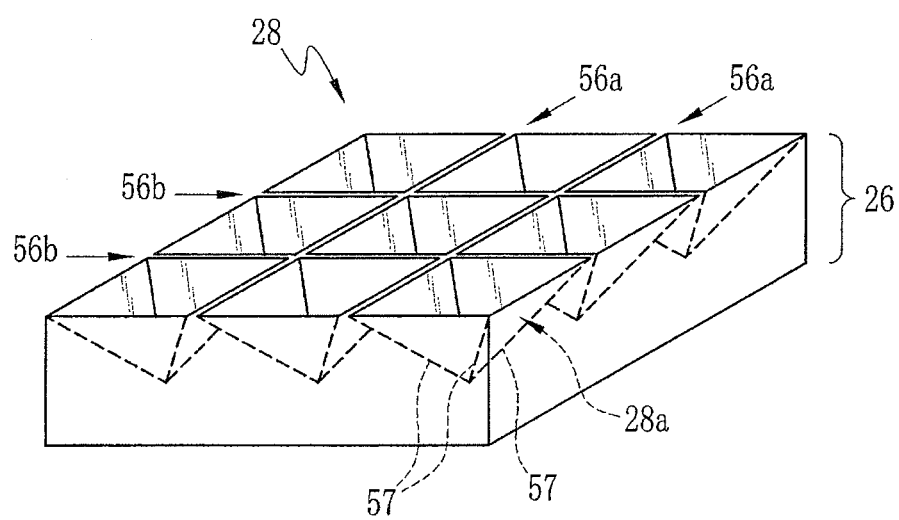
FIG. 11 is an explanatory view showing a concrete embodiment of the projection and depression structure.

Note that, as shown in FIG. 11, in the projection and depression structure 28 of the imaging device 10, the uniform shaped depressions 28a are arranged into a matrix. Thus, rectangular portions corresponding to the depressions 28a are cut out from the thermal oxide film 52, 55 to be used as the mask in forming the projection and depression structure 28 by etching of the single crystal silicon layer 26, and hence the thermal oxide film 52, 55 is formed into the shape of the sharp sign "#" so as to be left in parallel highest portions 56a between the depressions 28a and parallel highest portions 56b that are orthogonal to the highest portions 56a.

Figure 12:
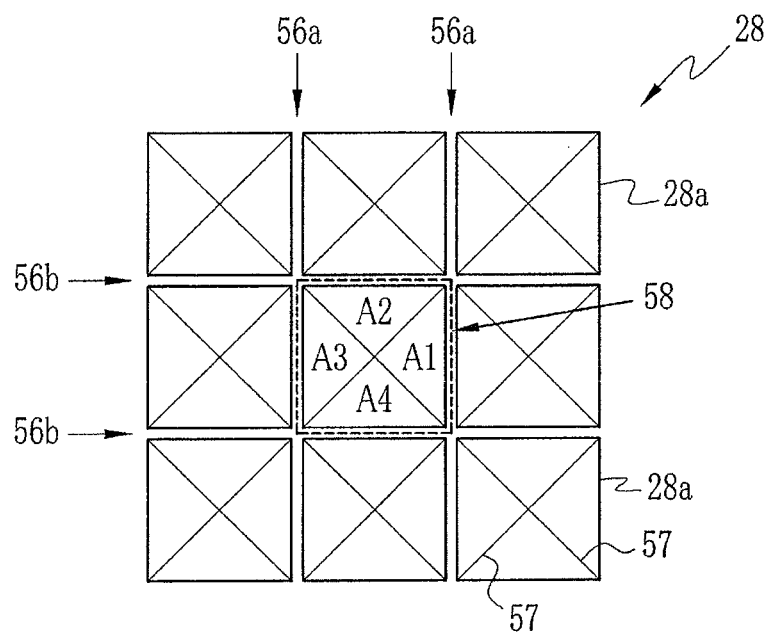
FIG. 12 is an explanatory view of the projection and depression structure viewed from a rear surface (light incident direction) side.

As shown in FIG. 12, since the projection and depression structure 28 is formed by the crystal anisotropic etching of the single crystal silicon layer 26, valley lines 57 of each depression 28a extend in predetermined directions in every depression 28a. Thus, every depression 28a uniformly has the shape of a square pyramid.

One PD 21 is provided in each inclined surface of the depression 28a, and four PDs 21 corresponding to the single depression 28a enclosed by a broken line compose a unit of phase difference pixels 58 for obtaining the horizontal and vertical phase differences. To be more specific, both an inclined surface A1 and an inclined surface A3 are (111) surfaces of the single crystal silicon inclined at a predetermined angle, and inclined in opposite directions each other symmetrically with respect to a vertex of the depression 28a to provide a horizontal asymmetrical property to an optical path of incident light. Thus, two PDs 21 corresponding to an inclined surface A1 and an inclined surface A3 out of the four PDs 21 being the phase difference pixels 58 compose a pair of phase difference pixels for obtaining horizontal phase difference information of the imaging device 10. Likewise, two PDs 21 corresponding to an inclined surface A2 and an inclined surface A4 compose a pair of phase difference pixels for obtaining vertical phase difference information of the imaging device 10. Therefore, in the imaging device 10, since each depression 28a is in the shape of a square pyramid, the four PDs 21 corresponding to the inclined surfaces A1 to A4 compose one unit of phase difference pixels 58 to obtain the vertical and horizontal phase difference information of the imaging device 10.

Note that, to provide the asymmetric optical path for the phase difference AF, the projection and depression structure 28 having the square pyramid-shaped depressions 28a is formed in the imaging device 10 in the above embodiment, but the configuration of the projection and depression structure 28 is not limited thereto. As described above, forming the square pyramid-shaped depression 28a allows the imaging device 10 to obtain the vertical and horizontal phase difference information, but the phase difference AF can be carried out by using only the horizontal (or vertical) phase difference information. Thus, the projection and depression structure 28 may be formed so as to obtain the phase difference information of one of the horizontal pair and the vertical pair.

Figure 13:
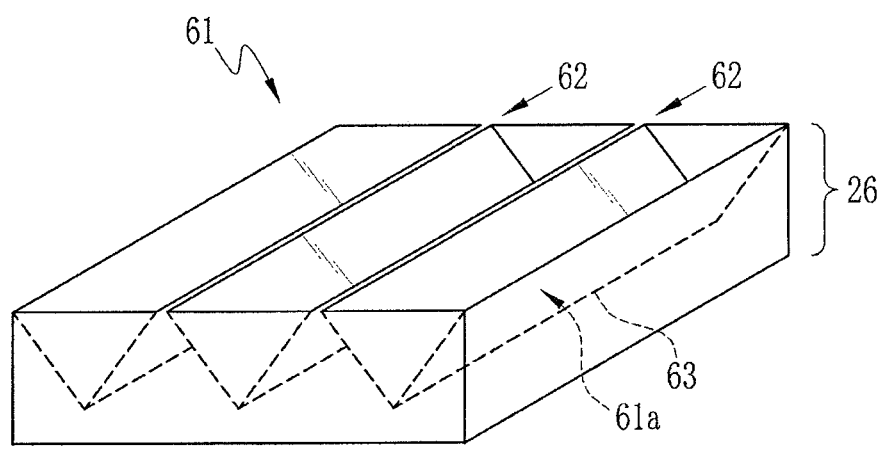
FIG. 13 is an explanatory view showing a projection and depression structure of another embodiment.

When only the horizontal (or vertical) phase difference information is obtained, as shown in FIG. 13, a projection and depression structure 61 may be formed in such a manner as to arrange a plurality of triangular prism-shaped depressions 61a in the single crystal silicon layer 26. To form the projection and depression structure 61, the thermal oxide film 52, 55 is patterned into stripes so as to remain in parallel highest portions 62 between the depressions 61a, and crystal anisotropic etching is performed using the striped thermal oxide film 52, 55 as a mask.

Figure 14:
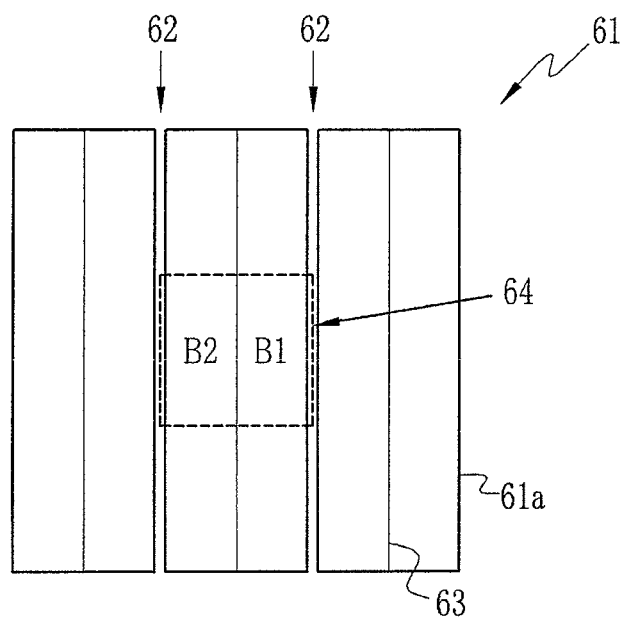
FIG. 14 is an explanatory view of the projection and depression structure according to the embodiment viewed from a rear surface side.

As shown in FIG. 14, by forming the projection and depression structure 61 using the crystal anisotropic etching, valley lines 63 of the all depressions 61a become in parallel and every depression 61a has a uniform triangular prism shape. Also, in the case of the projection and depression structure 61, two PDs 21 that are positioned in a part of the depression 61a enclosed by a broken line and correspond to an inclined surface B1 and an inclined surface B2, respectively, compose a unit of phase difference pixels 64 for obtaining the phase difference information in the horizontal (or vertical) direction. The inclined surface B1 and the inclined surface B2 have inclinations corresponding to the inclined surface A1 and the inclined surface A3 of the square pyramid-shaped depression 28a, respectively.

Figure 15A:
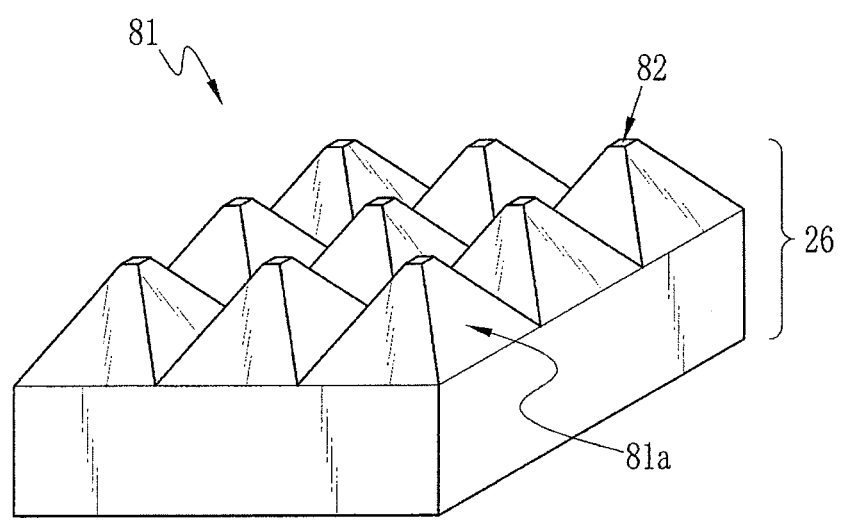
FIG. 15A is an explanatory view showing the configuration of a projection and depression structure having projections.

Note that, the projection and depression structure 28 having the square pyramid-shaped depressions 28a is formed by the crystal anisotropic etching of the single crystal silicon layer 26 in the above embodiment, but the configuration of the projection and depression structure 28 is not limited thereto. For example, as shown in FIG. 15A, a projection and depression structure 81 having a matrix of square pyramid-shaped projections 81a may be provided by crystal anisotropic etching of the single crystal silicon layer 26. In the case of forming the square pyramid-shaped projections 81a described above, the thermal oxide film 52 may be patterned such that a matrix of square portions remains in the position of highest portions 82 of the projections 81a.

Figure 15B:
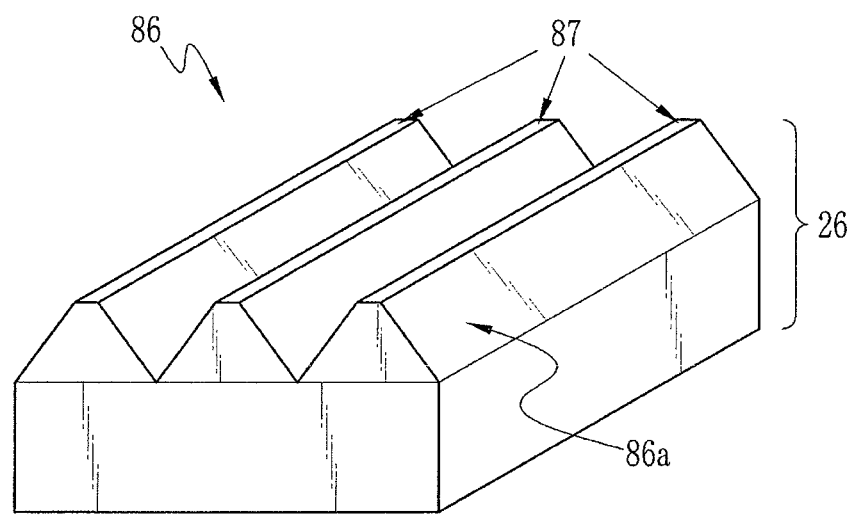
FIG. 15B is an explanatory view showing the configuration of a projection and depression structure having projections according to another embodiment.

Also, as shown in FIG. 15B, when only the horizontal (or vertical) phase difference information is obtained, a projection and depression structure 86 having triangular prism-shaped projections 86a may be formed. In this case, the thermal oxide film 52, 55 may be patterned so as to remain in the position corresponding to highest portions 87 of the projections 86a, and crystal anisotropic etching may be performed on the single crystal silicon layer 26.

Figure 16:
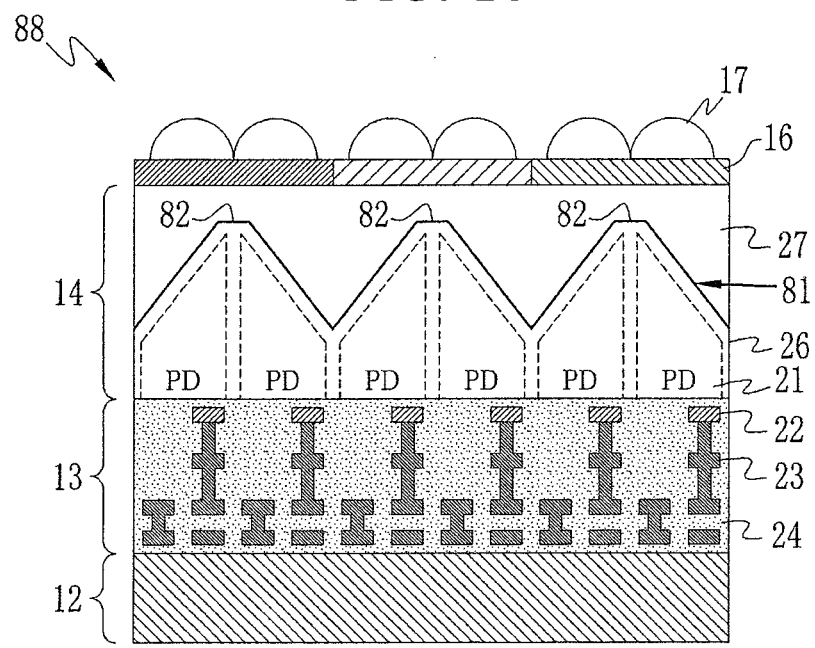
FIG. 16 is a cross sectional view showing a corresponding relation between the projection and depression structure having the projections and a color filter.

Note that, in the case of forming the projection and depression structure 81 having the square pyramid-shaped projections 81a, as described above, it is necessary to provide the color filter 16 such that the highest portion 82 of the projection 81a is positioned in the middle of one color segment, as shown in an imaging device 88 of FIG. 16. On the other hand, in the case of forming the projection and depression structure 86 having the triangular prism-shaped projections 86a, a valley between the projections 69a may be positioned in the middle of one color segment as with FIG. 1, or the highest portion 87 of each projection 69a may be positioned in the middle of one segment as with FIG. 16.

Figure 17:
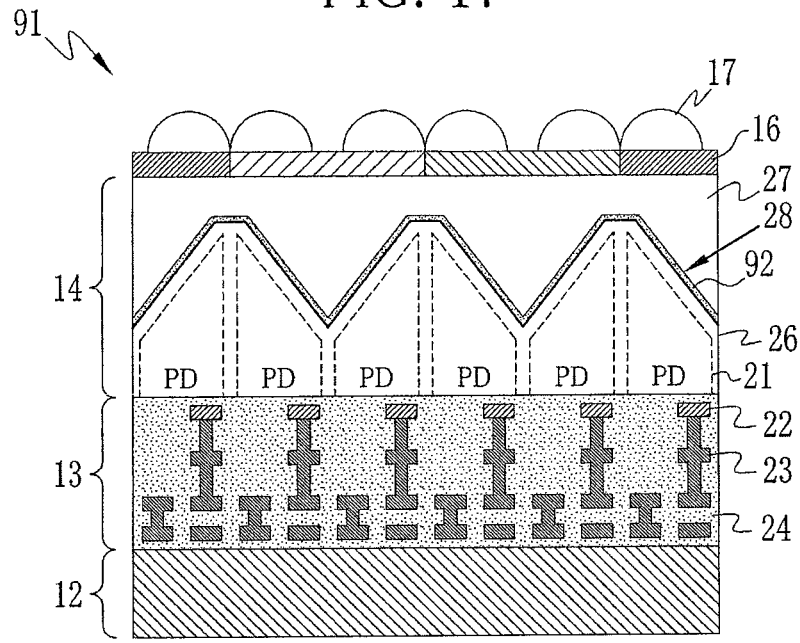
FIG. 17 is a cross sectional view showing an example of providing an anti-reflection film.
Figure 18:
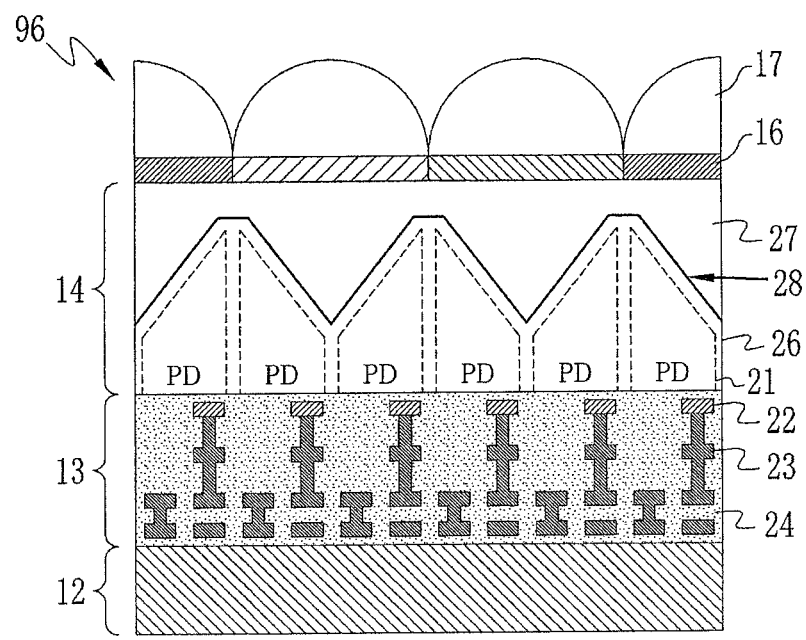
FIG. 18 is a cross sectional view showing an example in which microlenses of another embodiment are formed.

Note that, the single crystal silicon layer 26 and the planarizing layer 27 make contact with each other in the above embodiment, but the projection and depression structure 28 formed in the interface between the single crystal silicon layer 26 and the planarizing layer 27 sometimes causes occurrence of more reflected light, as compared with the case of having a flat interface. Thus, as shown in an imaging device 91 of FIG. 17, an anti-reflection film 92 is preferably provided in the interface between the single crystal silicon layer 26 and the planarizing layer 27. As the anti-reflection film 92, for example, a silicon oxide film or a silicon nitride film is suitable. The anti-reflection film 92 can be formed by evaporation or the like after forming the projection and depression structure 28 in the single crystal silicon layer 26 and before forming the planarizing layer 27.

Note that, in the above embodiments, the microlens 17 is provided so as to correspond to each PD 21. Instead of this, for example, one microlens 17 may be provided with respect to one unit (one depression 28a) of phase difference pixels.

Note that, in a manufacturing procedure of the imaging device 10, the single crystal silicon layer 26 is formed on the silicon substrate 51 by the epitaxial growth in the above embodiments, but a single crystal silicon substrate manufactured in another step may be adhered to the silicon substrate 51 to form the single crystal silicon layer 26.

Note that, the projection and depression structure 28 is provided in the entire interface between the single crystal silicon layer 26 and the planarizing layer 27 in the above embodiments, but the projection and depression structure 28 may be provided in the interface between the single crystal silicon layer 26 and the planarizing layer 27 of only the phase difference pixels in the case of intending only the phase difference AF. In the case of an imaging device used in a stereoscopic camera for obtaining a parallax image (so-called 3D image) having left and right parallax for stereoscopy, providing the same projection and depression structure 28 as the imaging device 10 to every pixel facilitates obtaining the 3D image, even with the use of a rear surface irradiation type imaging device having an aperture ratio of approximately 100%. The concrete arrangement of the pixels (PDs 21) and the color filter 16 is arbitrary.

Note that, in the above embodiments, a plurality of depressions 28a are arranged in the projection and depression structure 28, but the number of the depressions 28a may be one. The same goes for the depression 61a and the projections 81a and 86a.

Note that, the rear surface irradiation type CMOS is described as an imaging device in the above embodiments, but the present invention is available for another rear surface irradiation type imaging device including a CCD and the like.

Although the present invention has been fully described by the way of the preferred embodiment thereof with reference to the accompanying drawings, various changes and modifications will be apparent to those having skill in this field. Therefore, unless otherwise these changes and modifications depart from the scope of the present invention, they should be construed as included therein.

What is claimed is:

1. A manufacturing method of a solid-state imaging device comprising:
 a thermal oxide film forming step for forming a thermal oxide film on a silicon substrate;
 a silicon layer forming step for forming a silicon layer on said thermal oxide film;
 a light receiving layer forming step for forming in an exposed surface of said silicon layer a light receiving layer having an arrangement of a plurality of light receiving portions for accumulating signal charge produced by photoelectric conversion of incident light;
 a wiring layer forming step for forming on said silicon layer a wiring layer having an electrode and wiring for controlling said light receiving portions;
 a support substrate adhering step for adhering a support substrate on said wiring layer;
 a thermal oxide film patterning step for removing said silicon substrate to expose said thermal oxide film and patterning said thermal oxide film in a predetermined pattern;
 an etching step for etching said silicon layer by using said patterned thermal oxide film as a mask so as to form in said silicon layer a projection and depression structure that has alternately disposed two types of inclined surfaces having symmetric inclination directions, and is provided in said light receiving layer such that each of said inclined surfaces corresponds to each of said light receiving portions, and makes said incident light enter said light receiving portion by a light amount corresponding to an incident angle; and
 a planarizing layer forming step for forming on said projection and depression structure a planarizing layer for planarizing said projection and depression structure.

2. The manufacturing method of said solid-state imaging device as recited in claim 1, wherein said silicon layer is a single crystal silicon layer formed by epitaxial growth of silicon; and
 said etching performed in said etching step is crystal anisotropic etching.

* * * * *